United States Patent
Baude et al.

(10) Patent No.: US 7,088,145 B2
(45) Date of Patent: Aug. 8, 2006

(54) AC POWERED LOGIC CIRCUITRY

(75) Inventors: Paul F. Baude, Maplewood, MN (US); Michael A. Haase, St. Paul, MN (US)

(73) Assignee: 3M Innovative Properties Company, St. Paul, MN (US)

(*) Notice: Subject to any disclaimer, the term of this patent is extended or adjusted under 35 U.S.C. 154(b) by 138 days.

(21) Appl. No.: 10/328,461

(22) Filed: Dec. 23, 2002

(65) Prior Publication Data

US 2004/0119504 A1    Jun. 24, 2004

(51) Int. Cl.
*H03K 19/20* (2006.01)
*H03K 19/094* (2006.01)

(52) U.S. Cl. ......................................... 326/121; 326/95

(58) Field of Classification Search ................ 326/95, 326/96, 97, 98, 93, 21, 112, 121
See application file for complete search history.

(56) References Cited

U.S. PATENT DOCUMENTS

| | | | |
|---|---|---|---|
| 4,164,666 A | | 8/1979 | Hirasawa |
| 4,570,085 A | * | 2/1986 | Redfield ...................... 326/97 |
| 4,734,597 A | | 3/1988 | Ullrich et al. |
| 5,173,849 A | | 12/1992 | Brooks et al. |
| 5,426,382 A | | 6/1995 | Ooms et al. |
| 5,450,027 A | | 9/1995 | Gabara |
| 5,534,791 A | * | 7/1996 | Mattos et al. .................. 326/27 |
| 5,552,678 A | | 9/1996 | Tang et al. |
| 5,701,093 A | | 12/1997 | Suzuki |
| 5,870,031 A | | 2/1999 | Kaiser et al. |
| 6,133,835 A | | 10/2000 | De Leeuw et al. |
| 6,147,375 A | | 11/2000 | Yamazaki et al. |
| 6,167,236 A | | 12/2000 | Kaiser et al. |
| 6,275,401 B1 | | 8/2001 | Xia |
| 6,349,047 B1 | | 2/2002 | Yu |
| 6,384,727 B1 | | 5/2002 | Diprizio et al. |

(Continued)

FOREIGN PATENT DOCUMENTS

DE    42 30 350    3/1994

(Continued)

OTHER PUBLICATIONS

Inventor: Masahiko, Translation of Japanese Published Unexamined Patent Application (A) No. 57-104251, "Semiconductor Integrated Circuit Device", published Jun. 29, 1982, Application Filing No. 55-181590, filed Dec. 22, 1980.*

(Continued)

*Primary Examiner*—Daniel D. Chang
(74) *Attorney, Agent, or Firm*—Lucy C. Weiss; Steven J. Shumaker

(57) ABSTRACT

The use of an alternating current (ac) source to power logic circuitry can support satisfactory device performance for a variety of applications, while enhancing long-term stability of the circuitry. For example, when organic thin film transistor (OTFT)-based logic circuitry is powered by an ac power source, the logic circuitry exhibits stable performance characteristics over an extended period of operation. Enhanced stability may permit the use of OTFT logic circuitry to form a variety of circuit devices, including inverters, oscillators, logic gates, registers and the like. Such circuit devices may find application in a variety of applications, including integrated circuits, printed circuit boards, flat panel displays, smart cards, cell phones, and RFID tags. In some applications, the ac-powered logic circuitry may eliminate the need for ac-dc rectification components, thereby reducing the manufacturing time, expense, cost, complexity, and size of the component carrying the circuitry.

50 Claims, 15 Drawing Sheets

U.S. PATENT DOCUMENTS

| | | |
|---|---|---|
| 6,392,544 B1 | 5/2002 | Collins et al. |
| 6,404,268 B1 | 6/2002 | Hung et al. |
| 6,414,543 B1 | 7/2002 | Beigel et al. |
| 6,433,359 B1 | 8/2002 | Kelley et al. |
| 2003/0102471 A1 | 6/2003 | Kelley et al. |
| 2003/0102472 A1 | 6/2003 | Kelley et al. |
| 2003/0150384 A1 | 8/2003 | Baude et al. |
| 2003/0151118 A1 | 8/2003 | Baude et al. |
| 2003/0152691 A1 | 8/2003 | Baude et al. |
| 2003/0175551 A1 | 9/2003 | Smith et al. |

FOREIGN PATENT DOCUMENTS

| | | |
|---|---|---|
| JP | 57-104251 | 6/1982 |
| WO | WO 02056246 | 7/2002 |

OTHER PUBLICATIONS

EM Microelectronic—Marin SA, "Read Only Contactless Identification Device", p. 1-7, 2002, no month.

IEEE Transactions On Electron Devices, vol. 47, No. 5, May 2000. "Alternating-Current Thin Film Electroluminescent Devices, Moldin via SPICE Fowler-Nordheim Diode".

Advanced Materials, vol. 14, No. 2, Jan. 16, 2002, "Organic Thin Film Transistors for Large Area Electronics".

IEEE Electron Device Letters, vol. 21, No. 11, Nov. 2000, "Analog and Digital Circuits Using Organic Thin-Film Transistors on Polyester Substrates".

Applied Physics Letters, vol. 80, No. 6, Feb. 2002, "Organic Thin-Film Transistor-driven Polymer-Dispersed Liquid Crystal Displays on Flexible Polymeric Substrates".

University of Waterloo, Ontario, Canada, "Stability issues in Digital Circuits In Amorphous Silicon Technology" May 13-16, 2001.

Applied Physics Letters, vol. 78, No. 23, "Monolithically integrated, Flexible Display of Polymer-Dispersed Liquid Crystal Driven By Rubber-Stamped Organic Thin-Film Transistors", Jun. 2001.

* cited by examiner

AC POWERED LOGIC CIRCUITRY

FIELD

The invention relates to logic circuitry.

BACKGROUND

Thin film circuit devices, including transistors, diodes, and the like, are widely used in a variety of modern electronic devices, including integrated circuits, printed circuit boards, flat panel displays, smart cards, cell phones, and radio frequency identification (RFID) tags. Thin film circuit devices are typically formed by depositing, masking and etching a variety of conducting, semiconducting and insulating layers to form a thin film stack.

Typically, thin film transistors are based on inorganic semiconductor materials such as amorphous silicon or cadmium selenide. More recently, significant research and development efforts have been directed to the use of organic semiconductor materials to form thin film transistor circuitry.

Organic semiconductor materials offer a number of manufacturing advantages for transistor fabrication. In particular, organic semiconductor materials permit the fabrication of organic thin film transistors (OTFTs) on flexible substrates such as thin glass, polymeric or paper-based substrates. In addition, organic semiconductor materials can be formed using low-cost fabrication techniques such as printing, embossing or shadow masking. Although the performance characteristics of OTFTs have improved with continued research and development, device performance and stability continue to present challenges.

SUMMARY

In general, the invention is directed to logic circuitry powered by alternating current (ac) power sources. The invention may be applied to logic circuitry incorporating thin film transistors based on amorphous or polycrystalline organic semiconductors, inorganic semiconductors or combinations of both.

The use of an ac power source to power thin film transistor-based logic circuitry can support satisfactory device performance for a variety of applications, while enhancing long-term stability of the circuitry. For example, when OTFT circuitry is powered by an ac power source, the OTFT circuitry may exhibit stable performance characteristics over an extended period of operation.

Enhanced stability may permit the use of OTFT circuitry to form a variety of thin film transistor-based logic circuit devices, including inverters, oscillators, logic gates, registers and the like. Such logic circuit devices may find utility in a variety of applications, including integrated circuits, printed circuit boards, flat panel displays, smart cards, cell phones, and RFID tags.

For some applications, ac-powered thin film transistor circuitry may eliminate the need for an ac to dc rectification block, thereby reducing the manufacturing time, expense, cost, complexity, and size of the component carrying the thin film transistor circuitry. The ac power source directly powers the logic gate circuitry. In particular, the ac power source applies an ac power waveform to one or more individual logic gates, instead of applying dc power to the logic gates via an ac-dc rectification block.

In one embodiment, the invention provides an electronic circuit comprising a first transistor and a second transistor arranged to form a logic gate, and an alternating current (ac) source to directly power the logic gate with an ac power waveform.

In another embodiment, the invention provides a method comprising directly powering a logic gate formed by at least a first transistor and a second transistor with an alternating current (ac) power waveform produced by an alternating current (ac) power source.

In an added embodiment, the invention provides a radio frequency identification (RFID) tag comprising a logic gate formed by at least a first transistor and a second transistor, and a radio frequency converter that converts RF energy to alternating current (ac) power, and directly powers the logic gate with the ac power.

In a further embodiment, the invention provides a radio frequency identification (RFID) system comprising an RFID tag including first and second transistors arranged to form a logic gate, a radio frequency (RF) converter that converts RF energy to alternating current (ac) power and directly powers the logic gate with the ac power, and a modulator that conveys information, and an RFID reader that transmits the RF energy to the RFID tag for conversion by the RF converter, and reads the information conveyed by the modulator.

In another embodiment, the invention provides a ring oscillator circuit comprising a plurality of transistors arranged to form a series of inverter stages, the inverter stages being coupled to form a ring oscillator, and an alternating current (ac) source to directly power the inverter stages in the ring oscillator with an ac power waveform.

The invention can provide a number of advantages. For example, ac-powered logic circuitry, and particularly OTFT-based logic circuitry, may exhibit increased stability over an extended period of time, relative to dc-powered thin film transistor circuitry. In the case of a ring oscillator, for example, ac-powered thin film transistor circuitry may maintain oscillation amplitudes over a longer period of time relative to dc-powered thin film transistor circuitry.

The availability of stable OTFT circuitry, in particular, may promote wider use of OTFT circuitry in a variety of applications, with more reliable performance, durability and longevity. Consequently, various applications for OTFT circuitry may benefit from manufacturing advantages associated with OTFT circuitry, such as the ability to form circuitry on flexible substrates, such as thin glass, polymeric or paper-based substrates, and use lower-cost manufacturing techniques.

As a further advantage, the use of ac power for the thin film transistor circuitry may eliminate the need for the ac-dc rectifier component otherwise required in some applications for delivery of dc power to the circuitry. Accordingly, by eliminating the need for a rectifier component, the use of ac power may reduce the manufacturing time, expense, cost, complexity, and size of components carrying thin film transistor circuitry.

For RFID tags, as a particular example, the use of ac-powered thin film circuitry may substantially reduce the cost and size of the tag by eliminating the ac-dc rectifier component. In particular, by eliminating the need for a front-end rectifier block, ac-powered thin film logic circuitry can result in substantial cost and size savings in the design and manufacture of the RFID tag.

Additional details of these and other embodiments are set forth in the accompanying drawings and the description below. Other features, objects and advantages will become apparent from the description and drawings, and from the claims.

DETAILED DESCRIPTION

Figure 1:
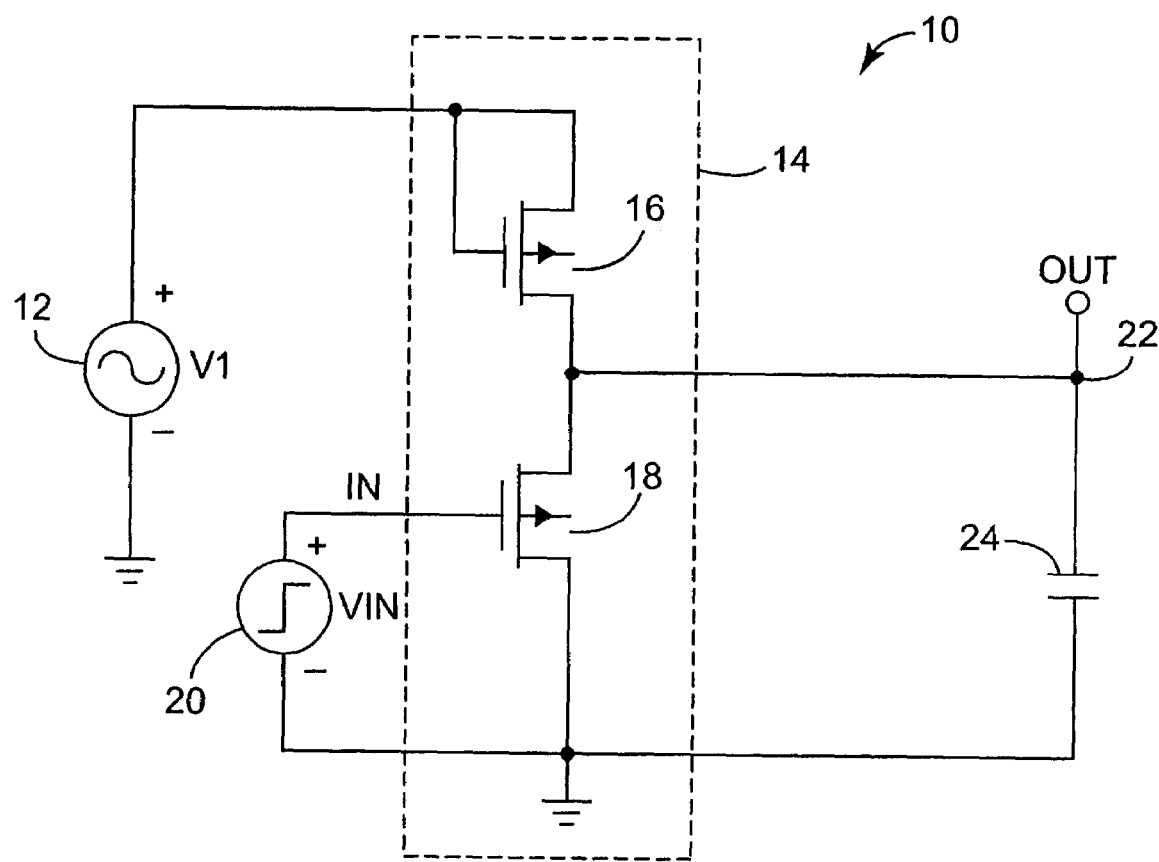
FIG. 1 is a circuit diagram illustrating an ac-powered inverter circuit.

FIG. 1 is a circuit diagram illustrating an ac-powered inverter circuit 10. Inverter circuit 10 may include an ac power source 12 that supplies ac power to a logic gate in the form of an inverter 14 having a load transistor 16 and a drive transistor 18. Each transistor 16, 18 may be a thin film field effect transistor, and may be based on an amorphous or polycrystalline inorganic or organic semiconducting material. As an example, organic semiconducting materials such as pentacene may be used to form OTFTs. As an alternative, circuit 10 may be formed by a combination of organic and inorganic semiconducting material, e.g., to form a complementary metal oxide semiconductor (CMOS) inverter circuit. For example, in some applications, inverter circuit 10 may be formed by an NMOS inorganic field effect transistor and a PMOS organic field effect transistor. When OTFTs are used, transistors 16, 18 may be especially adaptable to fabrication using low cost fabrication techniques, and may be formed on flexible substrates for some applications.

The ac power source 12 directly powers inverter 14 with an ac power waveform. The ac power is applied directly to inverter 14 in the sense that the inverter receives an ac power waveform instead of dc power produced by an ac-dc rectification component. In other words, inverter 14 operates in response to an ac power waveform. Accordingly, intervening circuitry may exist between ac power source 12 and inverter 14 provided that the inverter still receives an ac power waveform as operating power, rather than a dc power signal.

In the example of FIG. 1, the ac power waveform is applied directly across the common gate and drain connection of load transistor 16 and the ground connection coupled to the source of drive transistor 18.

The use of ac power source 12 to power thin film transistor-based logic circuitry, such as inverter 14 in FIG. 1, can support satisfactory device performance for a variety of applications, while enhancing long-term stability of the circuitry. For example, when inverter 14 is powered by ac power source 12, the inverter may exhibit stable performance characteristics over an extended period of operation relative to dc-powered inverters, especially for organic semiconducting materials. Also, for some applications, ac operation of inverter 14 will eliminate the need for an ac-dc rectifier component to power the inverter. The ac power waveform supplied to inverter circuit 10 may have a variety of regular shapes, e.g., sinusoidal, square, or sawtooth-shaped. In addition, in some embodiments, the ac power waveform may have irregular shapes. Accordingly, the ac power waveform exhibits an alternating current flow but is not limited to any particular shape. Nevertheless, in many applications, the ac power waveform may be a sinusoidal waveform.

As shown in FIG. 1, the gate and drain of load transistor 16 are coupled to ac power supply 12. The drain of drive transistor 18 is coupled to the source of load transistor 16, and the source of the drive transistor is coupled to ground. A signal source 20 drives the gate of drive transistor 18, e.g., with a logic signal. In response, inverter 14 produces an inverted output 22, which may be output across a load capacitor 24. Load capacitor 24 serves to filter out some of the ac voltage present at the output and provides for a cleaner output signal. The amount of filtering depends on the capacitance of load capacitor 24 and the frequency of the ac power. Load capacitor 24 may be formed by an input capacitance produced by gate/source overlap within a logic gate coupled to output 22 in the event inverter circuit 10 is coupled to drive one or more additional logic gates.

The gate/source overlap may be controlled during manufacture of a drive transistor 18 in a subsequent logic gate to produce a desired level of capacitance in load capacitor 24. Alternatively, load capacitor 24 may be formed independently, particularly if output 22 does not drive another logic gate. In some embodiments, load transistor 16 may have a gate width to gate length ratio that is greater than or equal to a gate width to gate length ratio of the drive transistor 18. In this case, direct current (dc) powering of the circuit would result in inferior operation of the logic gate, for NMOS or PMOS designs, because of the reduced gain. NMOS or PMOS ring oscillators based on this design, for example, would not operate if powered by direct current. An added benefit of having the gate width to gate length ratio of load transistor 16 greater or equal to the drive transistor 18 gate width to gate length ratio is that the total circuit area can be reduced.

Figure 2:
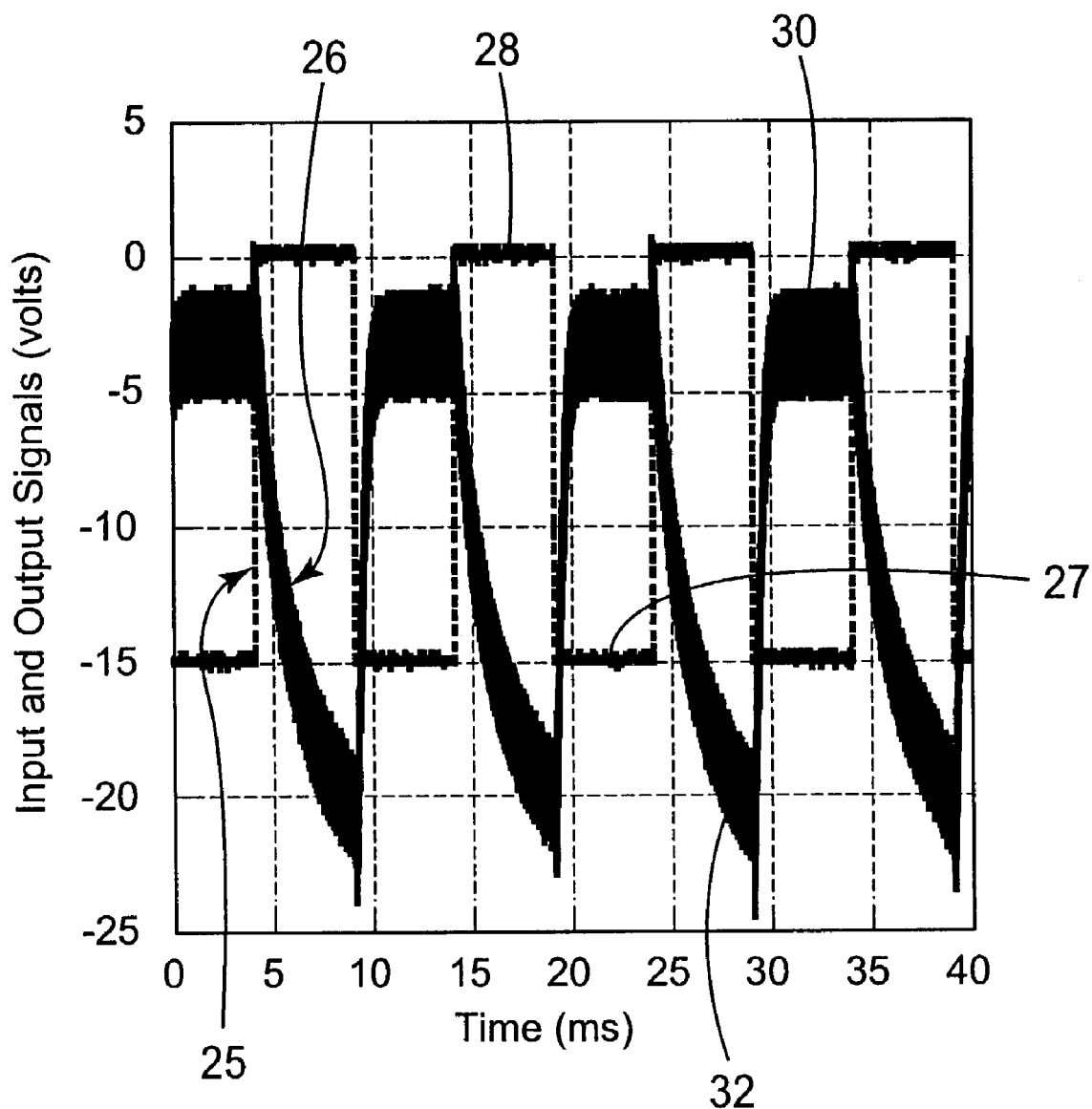
FIG. 2 is a graph illustrating simulated performance of the inverter circuit of FIG. 1.

FIG. 2 is a graph illustrating simulated performance of the inverter circuit 10 of FIG. 1. In particular, the graph illustrates signal voltage transitions over a period of time. For purposes of this simulation, transistors 16, 18 are modeled as PMOS organic field effect transistors. In FIG. 2, trace 25 is the input signal waveform applied to the gate of drive transistor 18 by signal source 20. Trace 26 is the output signal waveform produced by inverter 14 at output 22. In the example of FIG. 2, the input signal waveform transitions between a logic '0' state 28 and a logic '1' state 27. In response, inverter 14 produces an inverted output in response to the input signal waveform, i.e., a logic '1' state 32 and a logic '0' state 30, as shown in FIG. 2. Inverter 14 exhibits a propagation delay that is inversely related to the ac voltage applied to load transistor 16 and the mobility of the semiconductor material forming the inverter, and proportional to the parasitic capacitance within transistors 16, 18 and any external capacitance that may be independently added to inverter circuit 10. The ac power source 12 may have a frequency characterized by a period that is less than the propagation delay time of inverter 14.

In the example of FIG. 2, ac power source 12 produces a sinusoidal waveform having a frequency of 125 kHz and a peak-to-peak amplitude of 80 volts. Also, signal source 20 produces a square wave input signal waveform between approximately 0 and −15 volts, at approximately 100 Hz. Inverter 14 turns "on" in response to the ac power supply waveform applied by ac power source 12, and serves to invert the input signal waveform applied by signal source 20. The output 22 of inverter 14 may be applied to additional logic circuitry. In addition, a plurality of inverters 14 may be combined to form a variety of logic components, such as oscillators, logic gates, registers and the like. Although inverter circuit 10 is depicted in FIG. 1 for use as a logic gate, the inverter circuit may be used as an analog amplifier in some cases. In addition, inverter circuit 10 can be used to drive a variety of loads, including display elements such as liquid crystal display (LCD) elements, or light emitting diodes (LEDs), including organic light emitting diodes (OLEDs).

Figure 3:
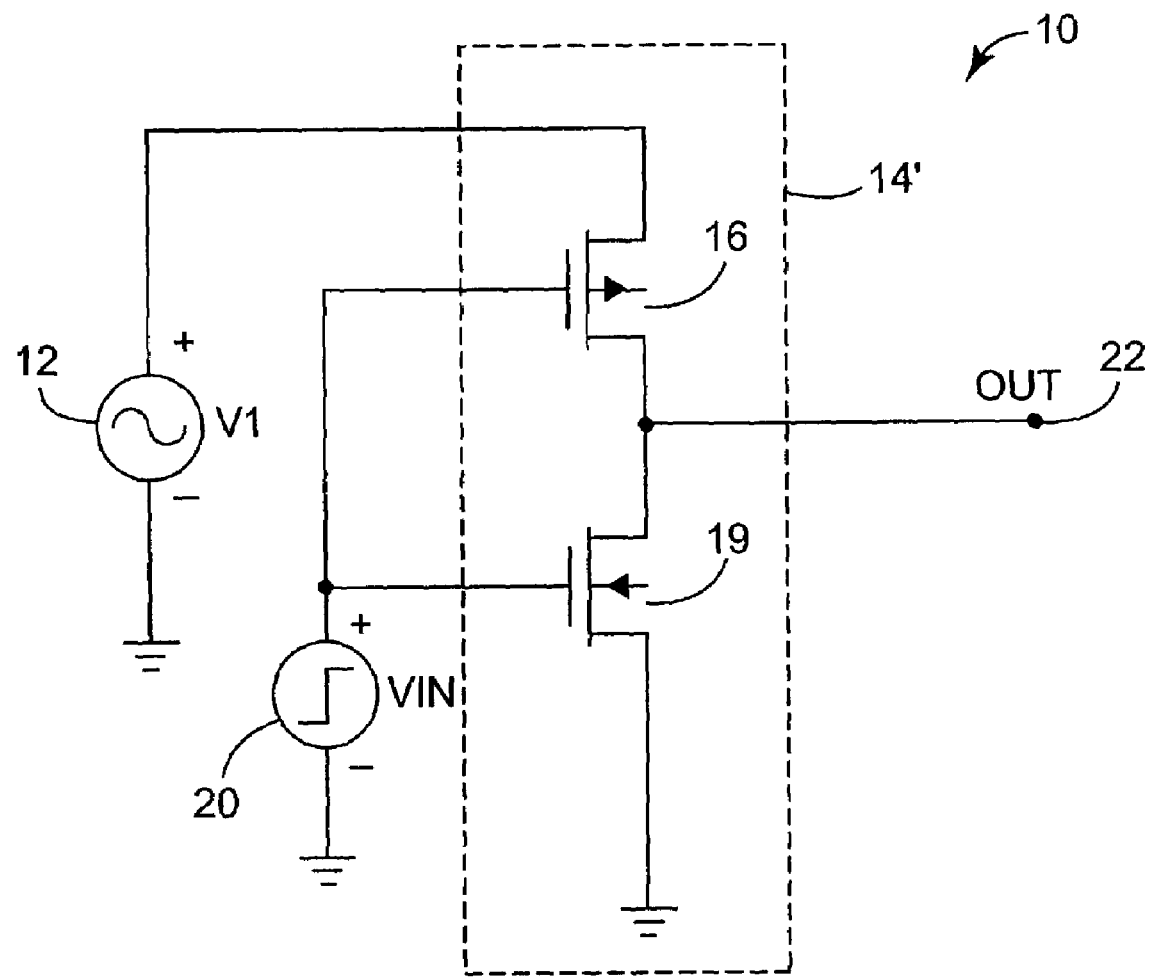
FIG. 3 is a circuit diagram illustrating an ac-powered inverter circuit based on complementary metal oxide semiconductor (CMOS) transistors.

FIG. 3 is a circuit diagram illustrating an ac-powered thin film transistor-based inverter circuit 14' incorporating CMOS-based circuitry. As shown in FIG. 3, the source of p-channel transistor 16 is coupled to ac power supply 12. An n-channel transistor 19 has a drain coupled to the drain of transistor 16. In addition, the gates of transistors 16, 19 are coupled together and driven by a signal source 20. Signal source 20 drives the gates of transistors 16, 19, e.g., with a logic signal. The source of transistor 19 is coupled to ground. The source of transistor 16 and the drain of transistor 19 are coupled together to form the output 22 of inverter circuit 14'. In response to the logic signal, inverter 14' produces an inverted output 22. In some embodiments, a load capacitor may be coupled between output 22 and ground. Again, the load capacitor may be formed by the input capacitance of a subsequent logic gate coupled to the output of inverter circuit 14'. Alternatively, a load capacitor may be formed independently to provide the desired load capacitance for output 22.

Figure 4:
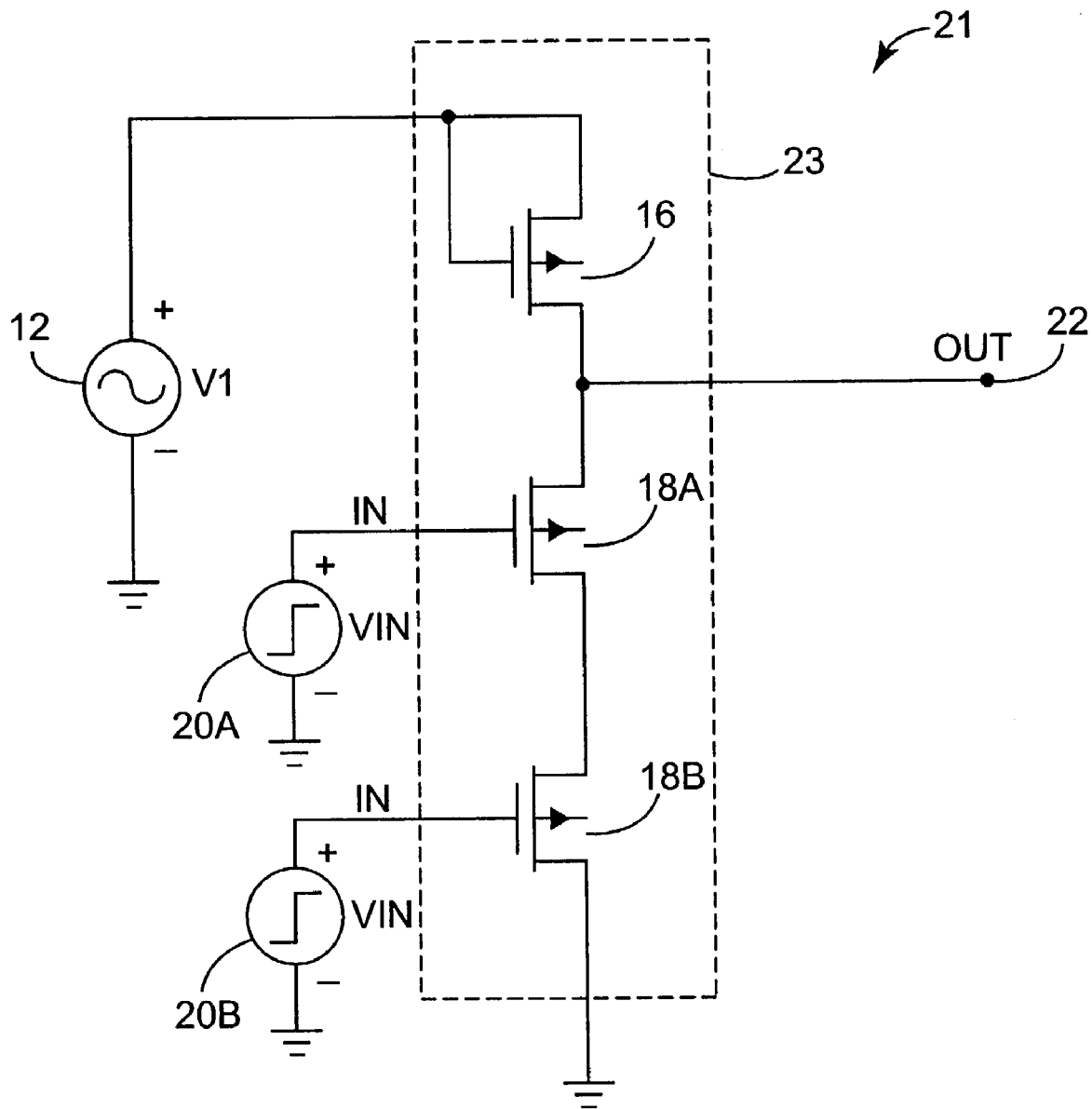
FIG. 4 is a circuit diagram illustrating an ac-powered NAND gate circuit.

FIG. 4 is a circuit diagram illustrating an ac-powered thin film transistor-based NAND gate circuit 21. As shown in FIG. 4, the gate and drain of load transistor 16 are coupled to ac power supply 12. The drain of first drive transistor 18A is coupled to the source of load transistor 16. The drain of second drive transistor 18B is coupled to the source of first drive transistor 18A. The source of second drive transistor 18B is coupled to ground. First and second signal sources 20A, 20B drive the gates of drive transistors 18A, 18B, respectively. In response, NAND gate 23 produces a logical NAND output 22. Transistors 16, 18A, 18B form a NAND gate. NAND circuit 21 is operative in response to the ac power supply signal delivered directly to the NAND circuit by ac power supply 12. In some embodiments, a load capacitor may be coupled across output 22. The load capacitor may be formed independently or realized by the input capacitance of a logic gate driven by output 22 of NAND circuit 21.

Figure 5:
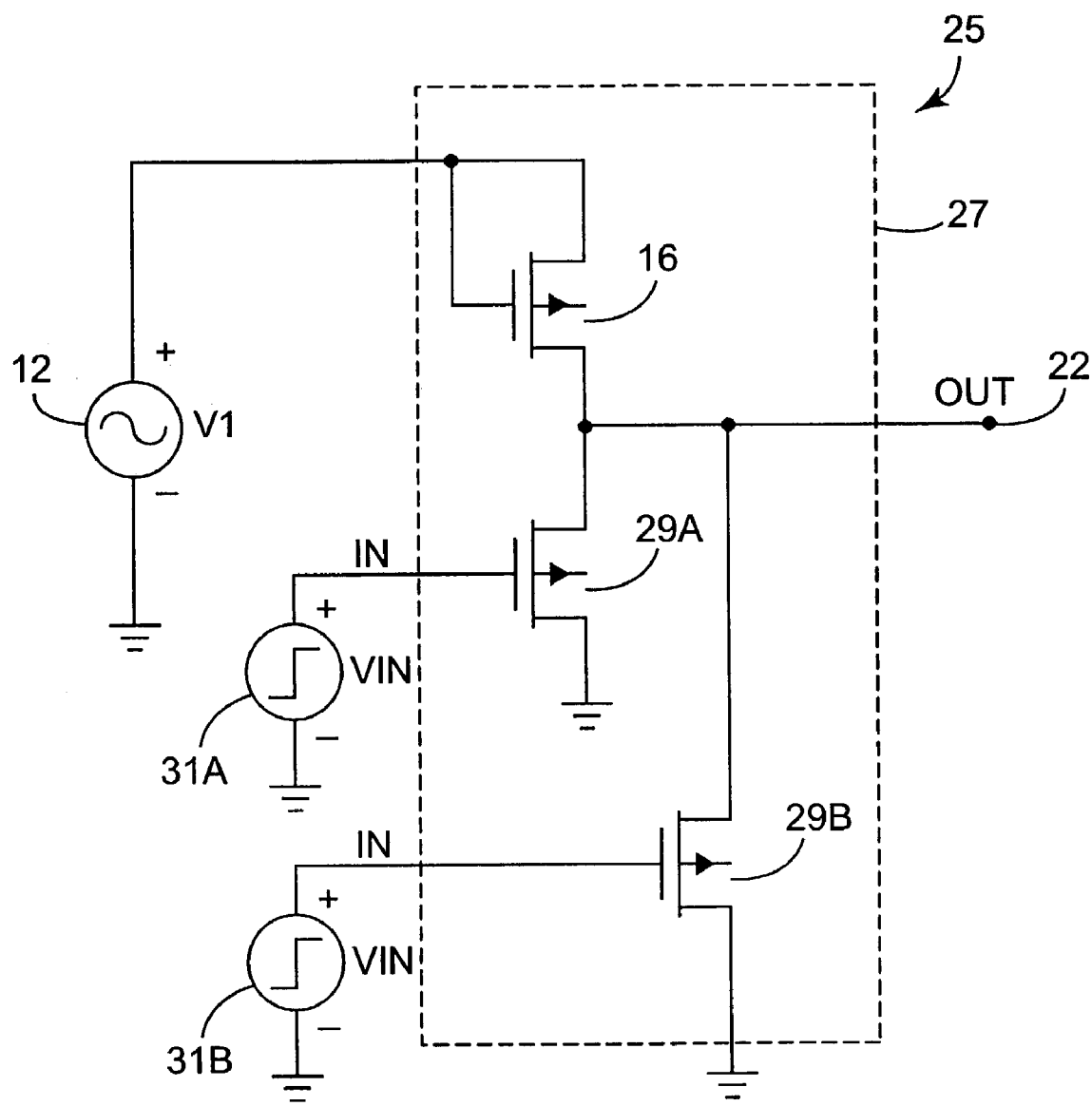
FIG. 5 is a circuit diagram illustrating an ac-powered thin film transistor-based NOR gate circuit.

FIG. 5 is a circuit diagram illustrating an ac-powered thin film transistor-based NOR gate circuit 25. FIG. 5 represents another example of a thin film transistor-based logic circuit that operates with an ac power supply, in accordance with the invention. As shown in FIG. 5, the gate and drain of load transistor 16 are coupled to ac power supply 12. Transistors 16, 29A, 29B form a NOR gate 27. The drains of first and second drive transistors 29A, 29B are coupled to the source of load transistor 16, and to output 22. The sources of first and second drive transistors 29A, 29B are coupled to ground. First and second signal sources 31A, 31B drive the gates of drive transistors 29A, 29B, respectively. In response, NOR gate 27 produces a logical NOR output 22. NOR circuit 25 is operative in response to the ac power supply signal delivered by ac power supply 12. In some embodiments, a load capacitor may be coupled across logical NOR output 22. The load capacitor may be formed independently or realized by the input capacitance of a logic gate driven by output 22 of NOR circuit 25.

Figure 6:
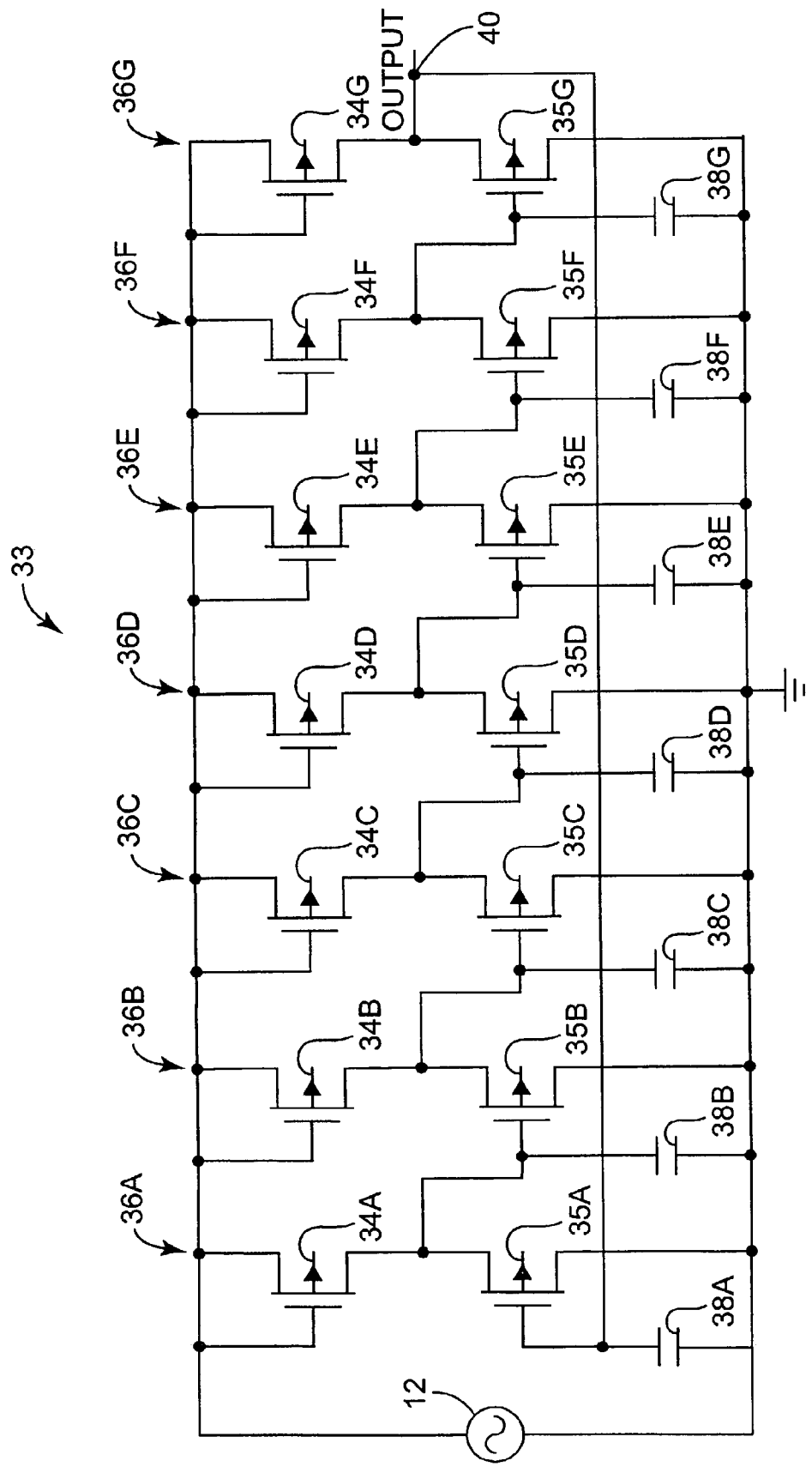
FIG. 6 is a circuit diagram illustrating an ac-powered thin film transistor-based ring oscillator circuit with load capacitors.

FIG. 6 is a circuit diagram illustrating an ac-powered thin film transistor-based ring oscillator circuit 33. Ring oscillator circuit 33 is an example of another circuit that can be implemented using ac-powered logic gates, e.g., including inverter stages based on OTFTs. As shown in FIG. 6, ring oscillator circuit 33 includes an odd number of inverter stages arranged in series. In the example of FIG. 6, ring oscillator circuit 33 includes seven inverter stages 36A–36G having, respectively, load transistors 34A–34G and drive transistors 35A–35G, respectively. Each transistor 34, 35 in ring oscillator circuit 33 is an ac-powered thin film field effect transistor. For example, ac power source 12 delivers ac power to the gates and drains of load transistors 34. The source electrodes of drive transistors 35 are coupled to ground.

In the example of FIG. 6, each inverter stage 36 has an output coupled across a respective load capacitor 38A–38G. For example, the output of inverter stage 36A is coupled across load capacitor 38B, and the output of inverter stage 36G is coupled across load capacitor 38A. Each capacitor 38 may be formed by the input capacitance produced by gate/source overlap within a drive transistor 35 of a subsequent inverter stage 36 that is driven by the output of a respective inverter stage. The output 40 of final inverter stage 36G is coupled to the gate of drive transistor 35A in first inverter stage 36A to provide feedback. Like inverter circuit 10 of FIG. 1, ring oscillator circuit 33 of FIG. 6 operates in response to the ac power supply waveform delivered by ac power supply 12. During operation, ring oscillator circuit 33 provides a clock signal. For example, the output of each inverter stage 36 in ring oscillator circuit 33 can be tapped to provide a clock signal with a desired phase.

Figure 7:
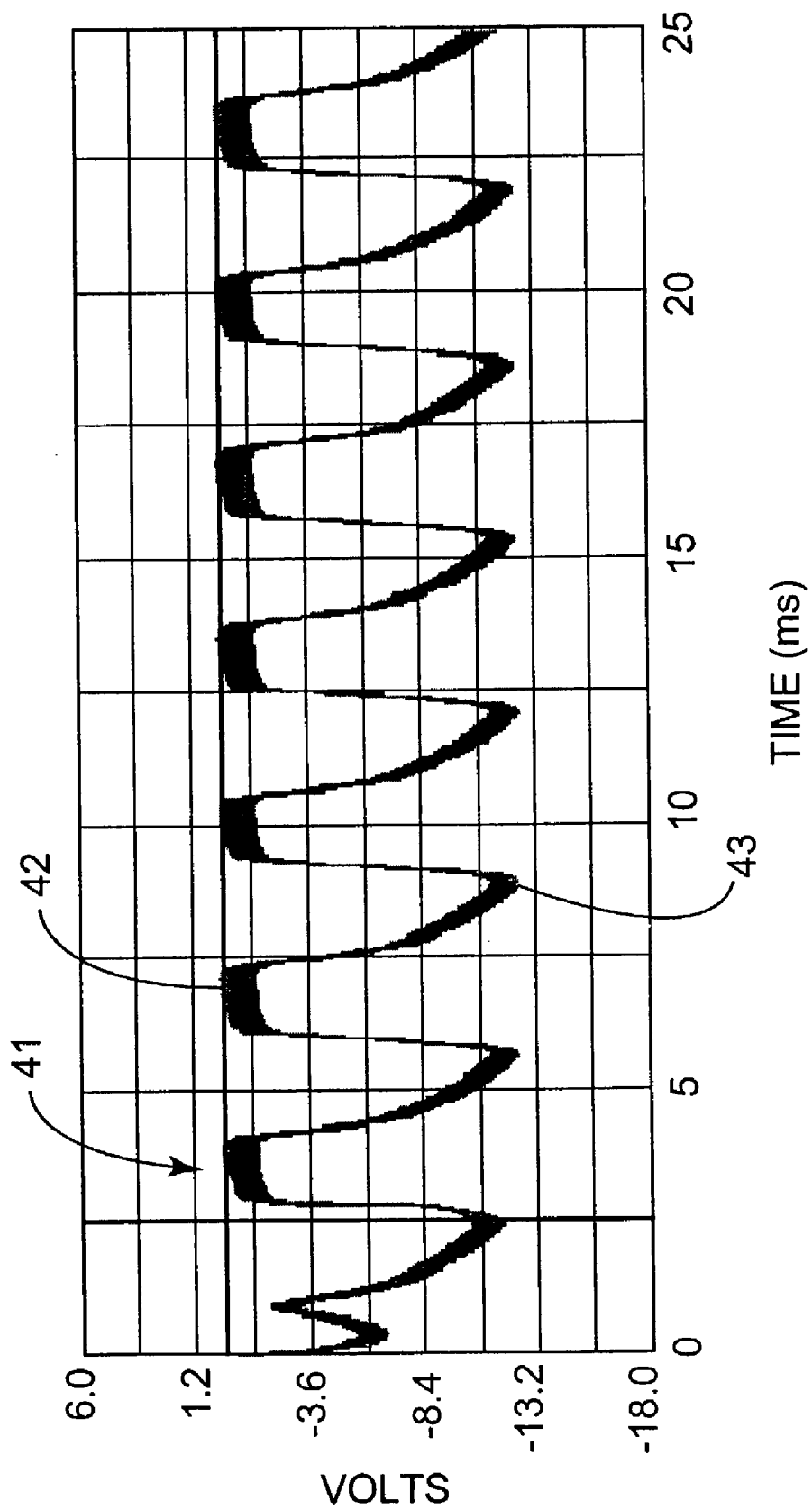
FIG. 7 is a graph illustrating simulated performance of the ring oscillator circuit of FIG. 6.

FIG. 7 is a graph illustrating simulated performance of the ring oscillator circuit 33 of FIG. 6. As shown in FIG. 7, ring oscillator 33 produces, as output 41, an oscillating output waveform 41 characterized by high peaks 42 and low peaks 43. In the example of FIG. 7, ac power source 12 produces a sinusoidal waveform having a frequency of 125 kHz and a peak-to-peak amplitude of 40 volts. Oscillating output waveform 41 in FIG. 7 exhibits a frequency of approximately 300 Hz. In general, the output waveform produced by a ring oscillator circuit will have a frequency that is dependent on the number of inverter stages 36 and the propagation delays produced by the individual inverter stages. The propagation delay is inversely related to the ac power supply voltage applied to ring oscillator circuit 33 and the mobility of the semiconducting material, and proportional to any applicable parasitic or external capacitance present in inverter stages 36.

Figure 8:
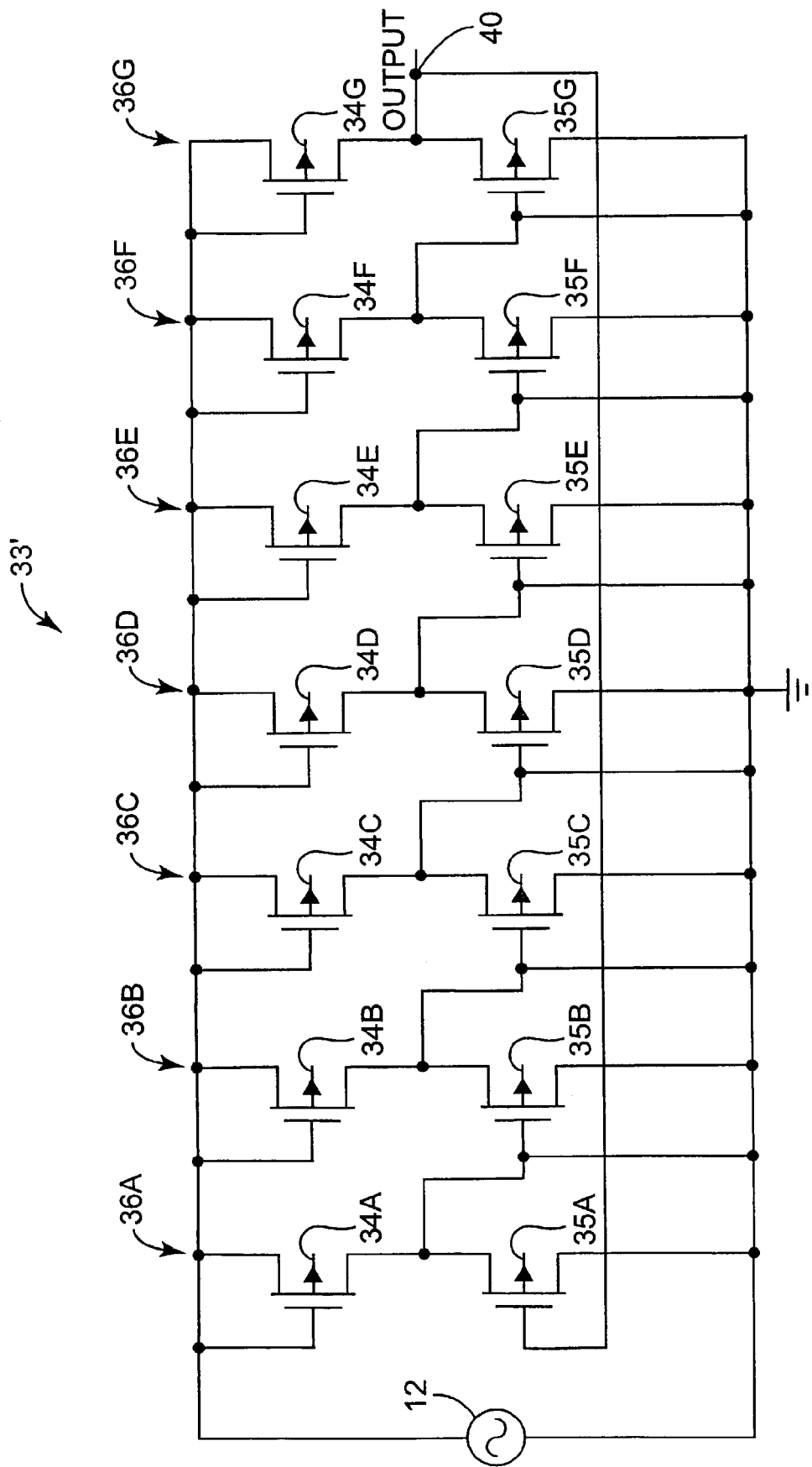
FIG. 8 is a circuit diagram illustrating an ac-powered thin film transistor-based ring oscillator circuit without load capacitors.
Figure 9:
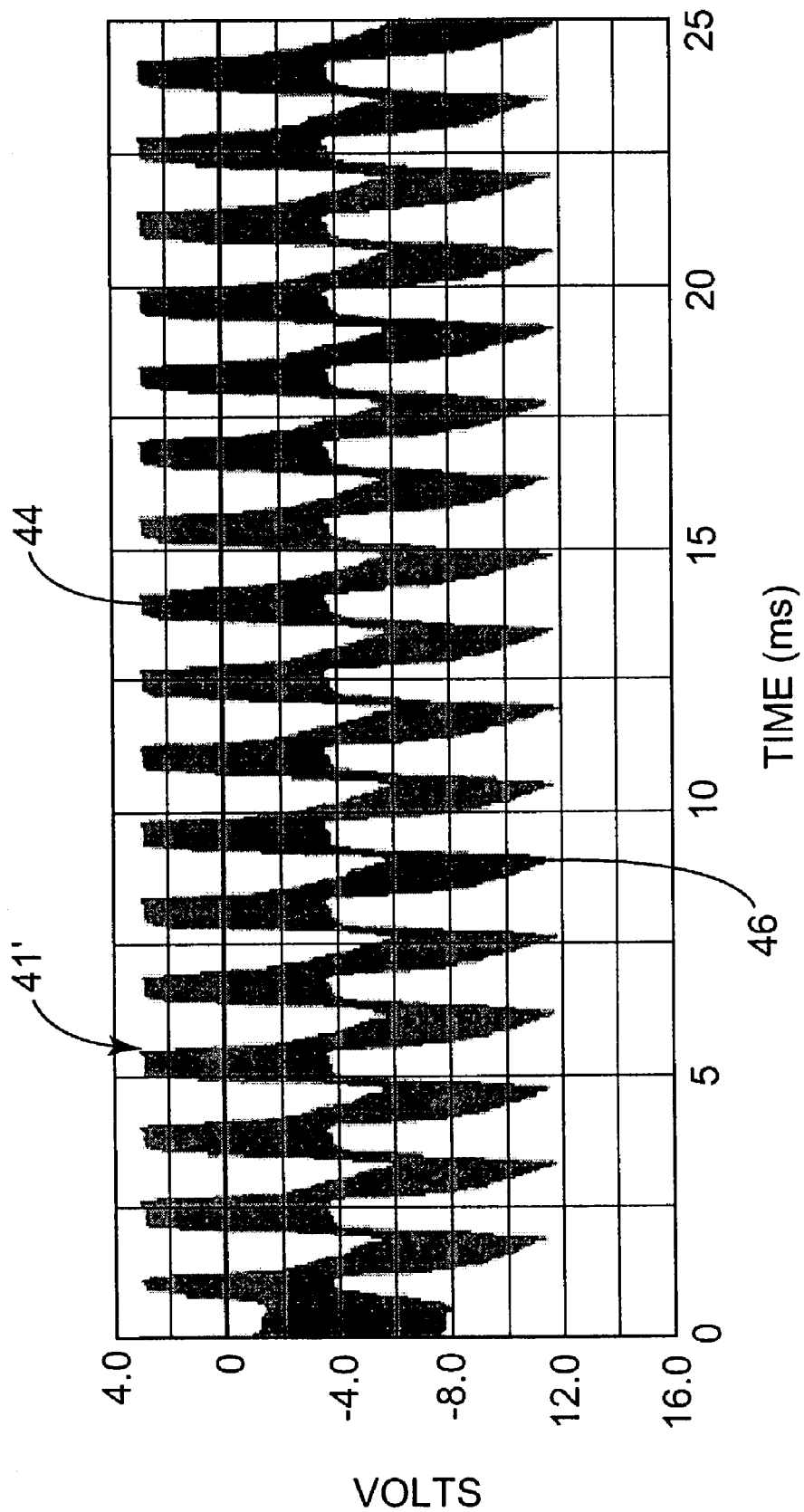
FIG. 9 is a graph illustrating simulated performance of the ring oscillator circuit of FIG. 8.

FIG. 8 is a circuit diagram illustrating an ac-powered thin film transistor-based ring oscillator circuit 33' without capacitors 38. FIG. 9 is a graph illustrating simulated performance of the ring oscillator circuit 33' of FIG. 8. Ring oscillator circuit 33' of FIG. 8 conforms substantially to ring oscillator circuit 33 of FIG. 6, but does not include capacitors 38 at the outputs of respective inverter stages 36. In the absence of capacitors 38, the oscillating output waveform 41', in FIG. 9 including peaks 44 and 46, reveals more of the 125 KHz ac power supply waveform.

Operation of thin film transistor circuitry, such as ring oscillator circuit 33, also is possible with higher ac power supply frequencies. Functioning ring oscillator circuits that conform substantially to circuit 33 have been observed to operate, for example, with ac power supply frequencies on the order of 6 MHz. With increased semiconductor mobility, it may be reasonable to expect use of ring oscillator circuits as described herein with ac power supply frequencies of greater than 10 MHz.

Figure 10:
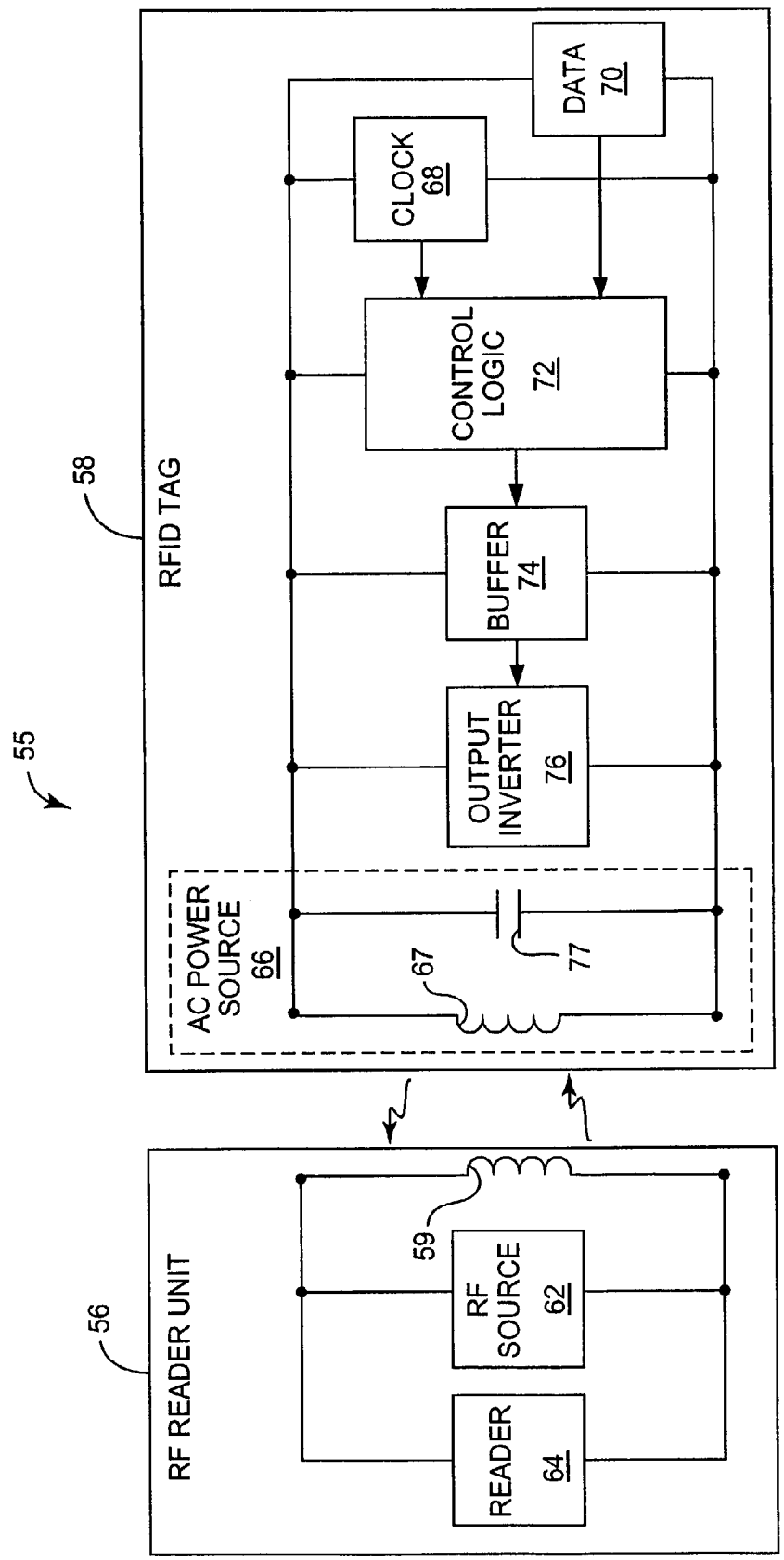
FIG. 10 is a block diagram illustrating application of ac-powered thin film transistor circuitry in an RFID tag/reader system.

FIG. 10 is a block diagram illustrating application of ac-powered thin film transistor-based circuitry in an RFID tag/reader system 55. Use of ac-powered thin film transistor-based circuitry may be particularly desirable in an RFID tag for a number of reasons, as will be described. As shown in FIG. 10, system 55 may include a reader unit 56 and an RFID tag 58.

Reader unit 56 may include a radio frequency (RF) source 62 and a reader 64. RF source 62 transmits RF energy to RFID tag 58 to provide a source of power. In this manner, RFID tag 58 need not carry an independent power supply, such as a battery. Instead, RFID tag 58 is powered across a wireless air interface between reader unit 56 and the RFID tag. To that end, reader unit 56 includes an inductor 59 that serves, in effect, as an antenna to transmit and receive RF energy.

As further shown in FIG. 10, RFID tag 58 may include an ac power source 66. As will be explained, ac power source 66 may serve to convert RF energy transmitted by reader unit 56 into ac power for delivery to thin film transistor circuitry carried by RFID tag 58. RFID tag 58 may receive the RF energy from reader unit 56 via an inductor 67 that serves as a receiver. A capacitor 77 also may be provided in parallel with inductor 67. RFID tag 58 further includes a clock circuit 68, data circuit 70, control logic circuit 72, output buffer circuit 74 and modulation inverter 76, one or more of which may be formed by an arrangement of thin film transistor circuitry.

Clock 68 drives control logic circuit 72 to output data from data circuit 70, which may comprise a plurality of data lines carrying an identification code. Output buffer circuit 74 buffers the output from control logic circuit 72. Modulation inverter 76, in turn, modulates the buffered output for interpretation by reader unit 56 via inductor 67. For example, modulation inverter 76 conveys the information by modulating the signal applied across inductor 67.

Figure 11:
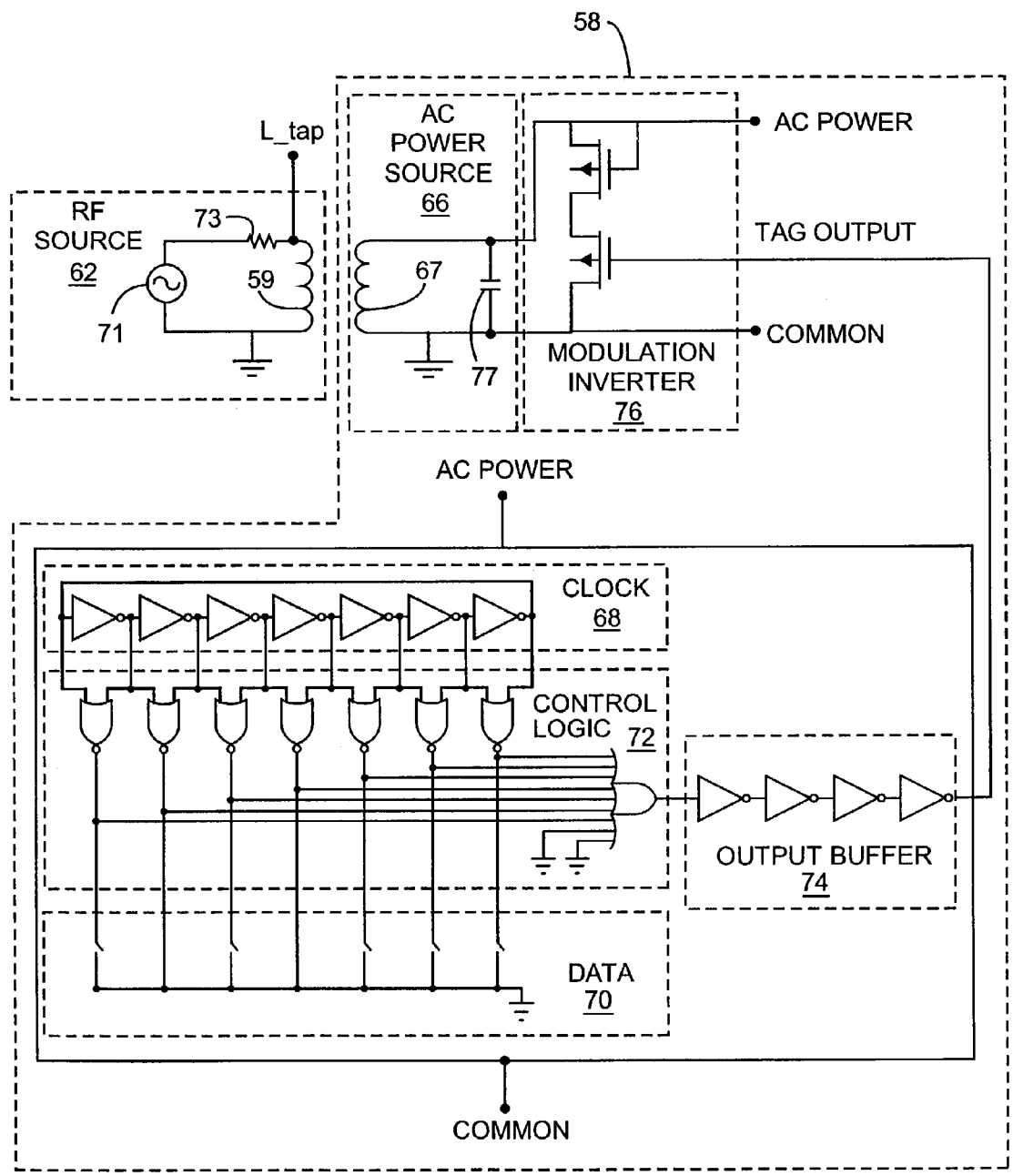
FIG. 11 is a circuit diagram further illustrating the RFID tag/reader system of FIG. 10.

FIG. 11 is a circuit diagram further illustrating the RFID tag/reader system 55 of FIG. 10. As shown in FIG. 11, RF source 62 may include an ac generator 71 that transmits an ac output signal via inductor 59. For some applications, ac generator 71 may take the form of a sinusoidal current source with an output of approximately 0 to 5 amps at a frequency of approximately 125 kHz.

Inductors 59 and 67 form a transformer for electromagnetic coupling of RF energy between RF source and RFID tag 58. Resistor 73 is selected to limit current. A capacitor 77 is placed in parallel with inductor 67 within ac power source 66 to form a parallel resonant tank that governs the frequency of the ac power source according to the equation:

$$f = \frac{1}{2\pi\sqrt{LC}},$$

where L is the inductance of inductor 67 and C is the capacitance of capacitor 77. With an inductance of 50 µH and a capacitance of 32 nF, inductor 67 and capacitor 77 generate a resonant frequency of approximately 125 KHz. Hence, in this example, the output of ac power source 66 is a sinusoidal waveform with a frequency of approximately 125 kHz. This waveform is then applied to clock circuit 68, control logic 72, data lines 70 and output buffer 74 as represented in FIG. 11 by the terminals AC POWER and COMMON.

FIG. 11 depicts an RFID tag 58 that carries an n-bit identification code. For ease of illustration, RFID tag 58 carries a 7-bit identification code specified by data lines 70. In many applications, RFID tag 58 may carry a much larger identification code, e.g., 31-bit, 63-bit or 127-bit codes. In some embodiments, selected data lines 70 may carry information used for start bit identification, data stream synchronization and error checking. In the example of FIG. 11, clock circuit 68 is a ring oscillator formed by a series of seven inverter stages arranged in a feedback loop.

The ring oscillator of FIG. 11 may be similar to ring oscillator 33 or 33' of FIGS. 6 and 8. The outputs of two successive inverters are applied to a respective NOR gate provided in control logic 72. In this way, seven NOR gates are used to generate a sequence of seven pulses within each clock cycle produced by the ring oscillator. Note that the number of NOR gates in control logic 72 may vary. Again, this arrangement could be extended, in principle, to larger numbers of bits, e.g., n=31, 63 or 127.

Switches shown in series with data lines 70 are connected to respective NOR gate outputs at one end. If a switch is closed, the respective data line couples the NOR gate output to ground If the switch is open, the NOR gate output is coupled as one of the inputs to a 7-input OR gate within control logic 72.

In the example of FIG. 11, the switches for second and fourth data lines (from left to right) are closed. As a result, data lines 70 store the 7-bit identification code "1010111." The switches can be made, for example, from metal lines that extend from the NOR gate outputs to ground. The electrical connections to ground can be intentionally broken or connected during manufacturing to produce, in effect, an open switch, and thereby encode a unique identification code into data lines 70 of RFID tag 58. The electrical connections may be broken by a variety of manufacturing techniques such as, for example, laser etching, mechanical scribing, electrical fusing, or shadow masking.

The output of the 7-input OR gate in control logic 72 is applied to a cascade of buffer amplifiers in output buffer 74 to help match the output impedance of the logic circuitry to the input impedance of the modulation inverter 76. The output of the buffer amplifiers in output buffer 74 is applied to the input of the modulation inverter 76. Specifically, the signal TAG OUTPUT is applied to the gate of the drive transistor associated with modulation inverter 76. Modulation inverter 76 then modulates the Q of the tank formed by inductor 67 and capacitor 77 to provide amplitude modulation of the carrier signal. In this manner, the received buffer output is conveyed to reader unit 56 so that the identification code can be read by reader 64. In particular, reader 64 processes the signal received at L_tap via inductor 59.

Figure 12:
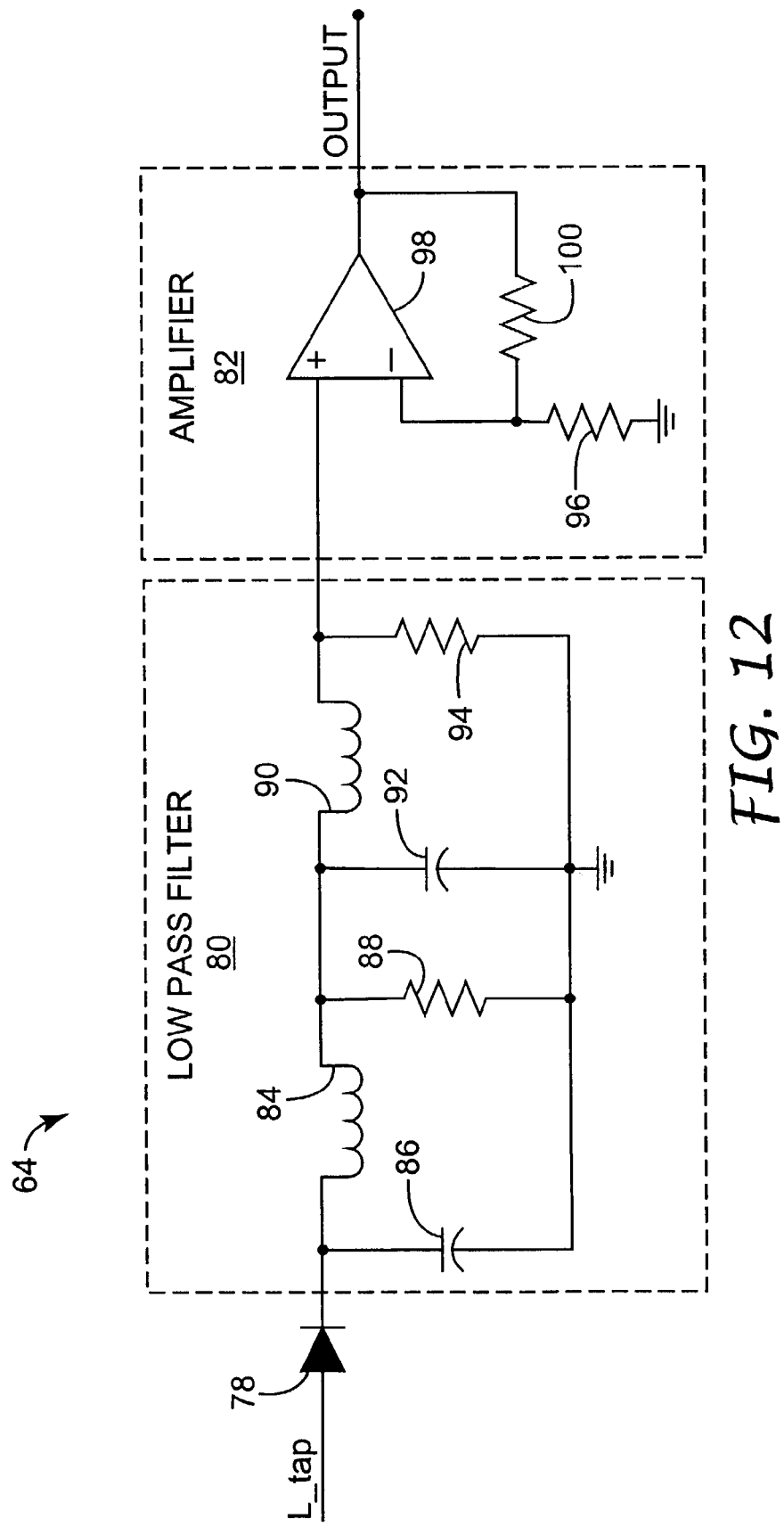
FIG. 12 is a circuit diagram further illustrating a reader associated with the RFID tag/reader system of FIG. 10.

FIG. 12 is a circuit diagram further illustrating reader 64 associated with the RFID tag/reader system 55 of FIG. 10. Reader 64 receives, via L_tap, a signal containing the carrier signal, e.g., at 125 kHz, modulated by the TAG OUPUT signal, which may be on the order of 1 kHz, depending on the frequency of clock circuit 68. A low junction capacitance signal diode 78 is used to demodulate the signal. A low pass filter section 80 removes the carrier frequency, and may include inductor 84, capacitor 86, resistor 88, inductor 90, capacitor 92 and resistor 94. An amplifier stage 82 includes an amplifier 98 in a non-inverting configuration, with resistor 96 and feedback resistor 100 coupled to the inverting input.

Figure 13:
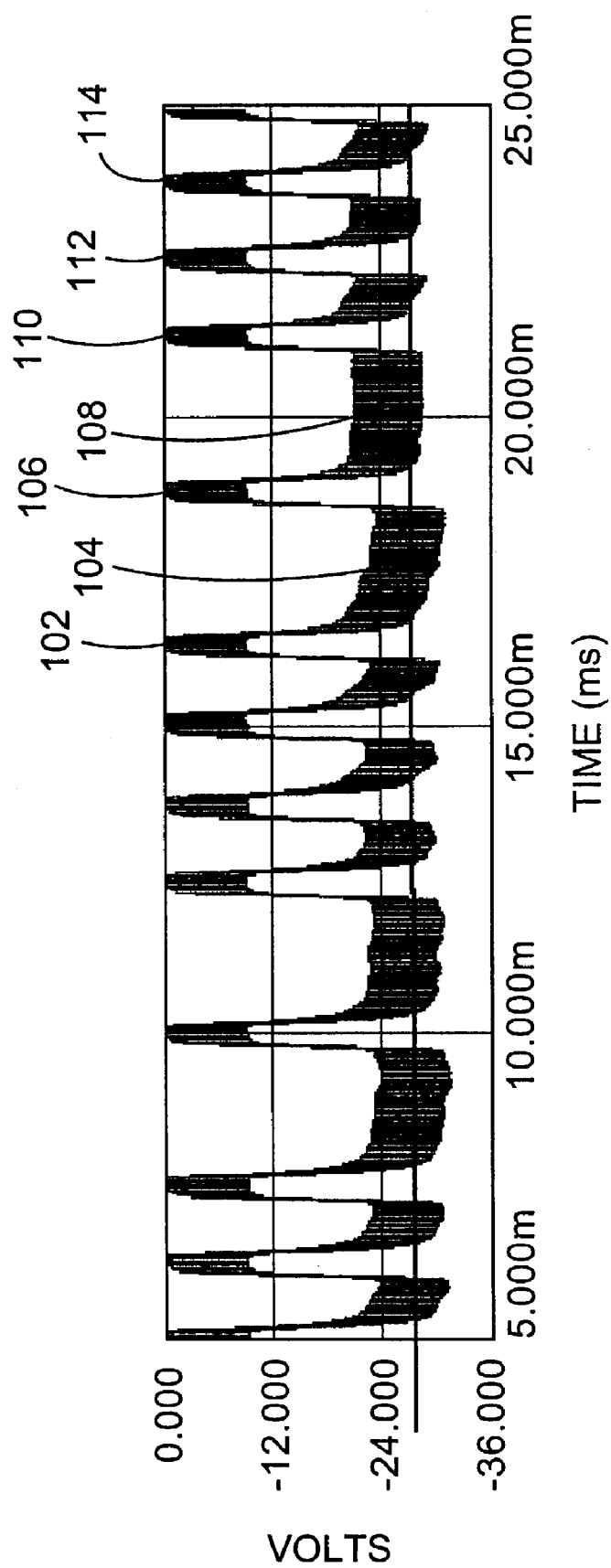
FIG. 13 is a graph illustrating simulated output of an RFID tag constructed using ac-powered thin film transistor circuitry.

FIG. 13 is a graph illustrating simulated output of an RFID tag constructed using ac-powered thin film transistor circuitry as shown in FIGS. 10–12. In particular, FIG. 13 shows the transition of the signal TAG OUTPUT generated from output buffer 74. As shown in FIG. 13, during the application of the ac power supply waveform to clock circuit 68, control logic 72, data lines 70, and output buffer 74, the circuitry is operative to produce a train of pulses in sequence with the clock circuit 68.

FIG. 13 shows a transition between bit 0 (102), bit 1 (104), bit 2 (106), bit 3 (108), bit 4 (110), bit 5 (112) and bit 6 (114) of the identification code specified by data lines 70. In particular, it can be seen from FIG. 13 that the 7-bit code transitions from high to low in a pattern corresponding to the code 1010111. Accordingly, such a pattern can be readily resolved by reader 64 to determine the identification code carried by RFID tag 58.

Figure 14:
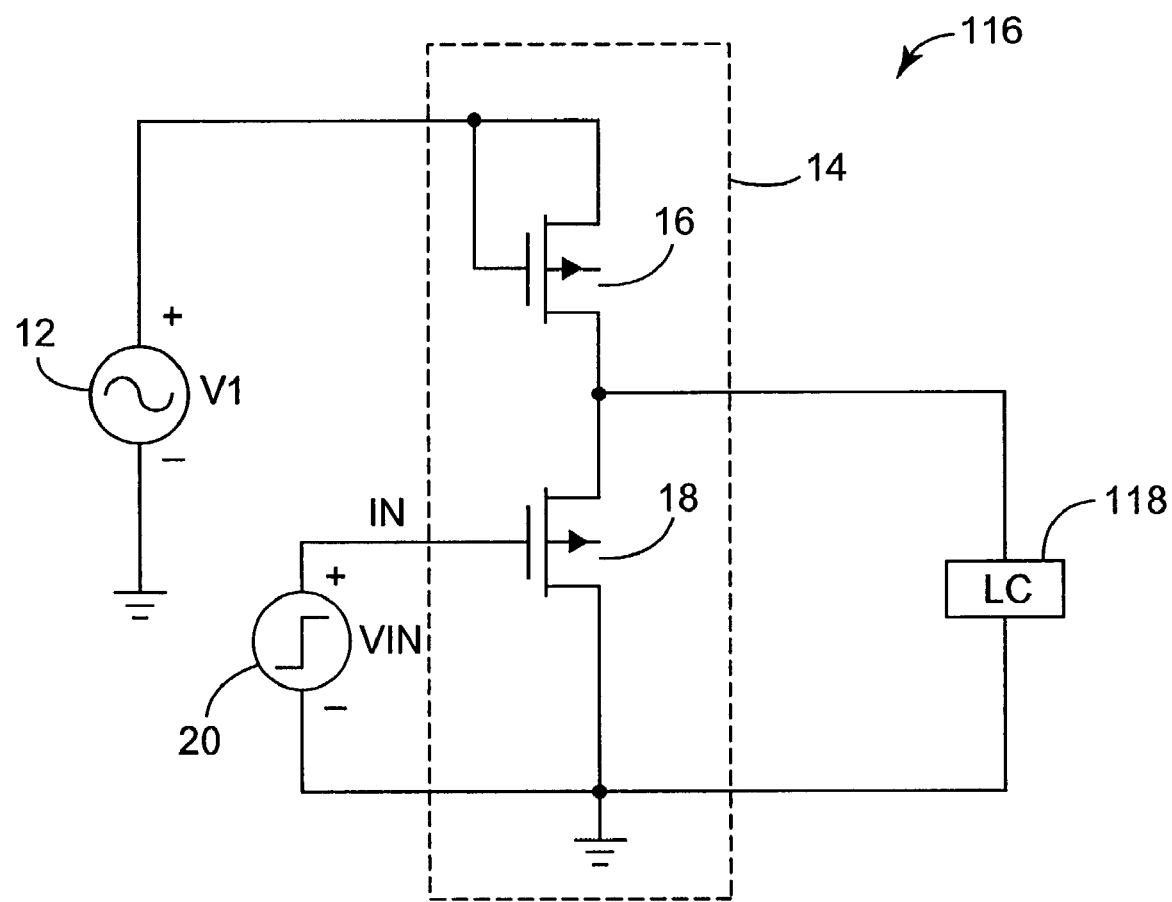
FIG. 14 is a circuit diagram illustrating an ac-powered inverter circuit that drives a liquid crystal display element.

FIG. 14 is a circuit diagram illustrating an ac-powered thin film transistor-based inverter circuit 116 that drives a liquid crystal display element 118. In the example of FIG. 14, inverter circuit 116 conforms substantially to inverter circuit 10 of FIG. 1. However, the output of inverter 14 drives a liquid crystal display element 118. In particular, one electrode of liquid crystal display element 118 is coupled to the source of load transistor 16 and the drain of drive transistor 18. The other electrode of liquid crystal display element 118 is coupled to ground.

Figure 15:
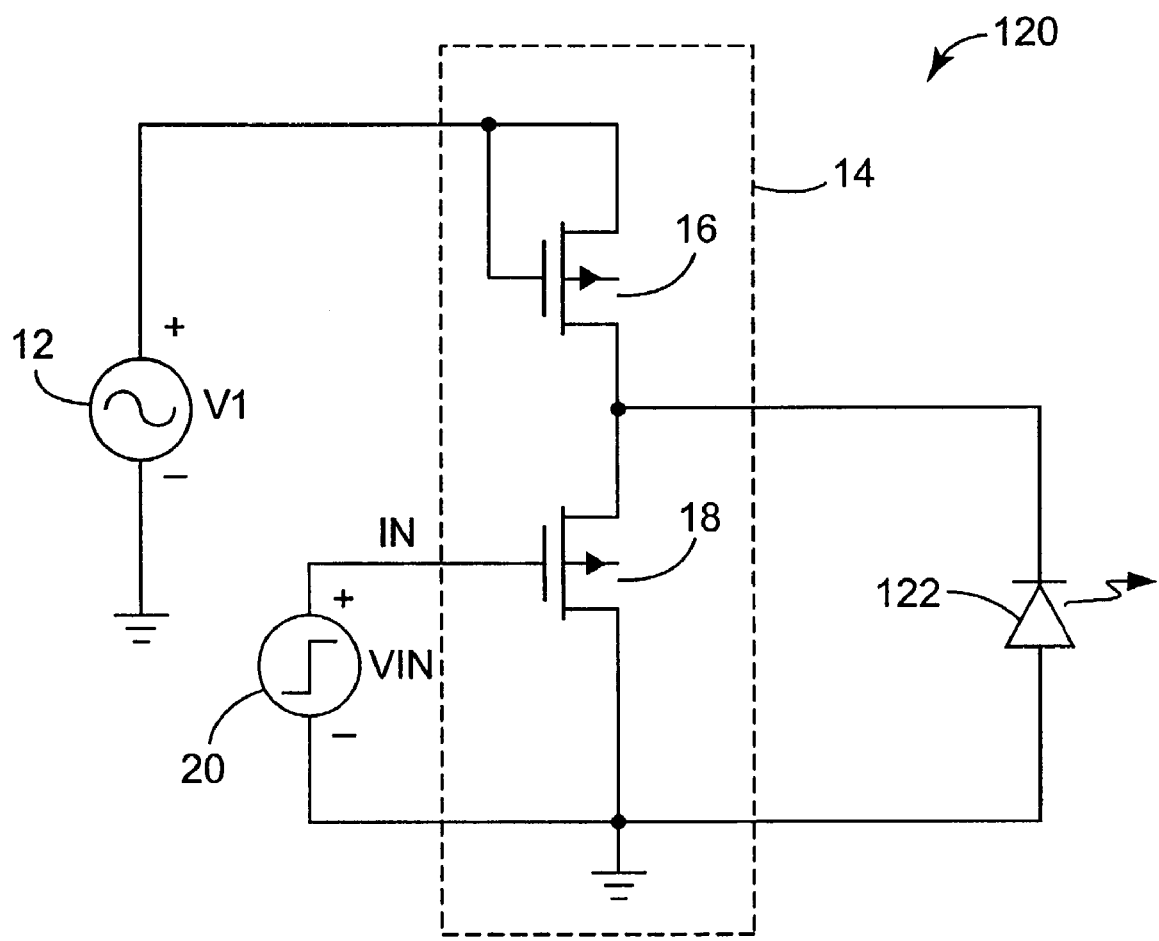
FIG. 15 is a circuit diagram illustrating an ac-powered inverter circuit that drives a light emitting diode (LED).

FIG. 15 is a circuit diagram illustrating an ac-powered thin film transistor-based inverter circuit 120 that drives a light emitting diode (LED) 122. Inverter circuit 120 conforms substantially to inverter circuit 10 of FIG. 1, but drives an LED 122. The cathode of LED 122 is coupled to the source of load transistor 16 and the drain of drive transistor 18, and the anode of the LED is coupled to ground.

The invention can provide a number of advantages. For example, ac-powered logic circuitry, and particularly OTFT-based logic circuitry, may exhibit stable performance over a longer period of time, relative to dc-powered thin film circuitry. Although dc-powered OTFT logic circuitry appears to undergo substantial changes in threshold voltage over time, the overall performance of ac-powered OTFT logic circuitry does not seem to change as quickly. Instead, ac-powered OTFT circuitry seems to be more stable over an extended period of time.

In the case of a ring oscillator, for example, ac-powered OTFT circuitry appears to maintain oscillation amplitudes over a much longer period of time relative to dc-powered OTFT circuitry. When OTFT-based ring oscillators are powered with dc power and monitored over time, the oscillation amplitude can exhibit a rather rapid decrease. When the same type of ring oscillator is ac powered, however, the rapid decrease does not occur. In particular, consistent oscillation amplitude has been observed for an ac-powered OTFT-based ring oscillator running continuously for over sixty hours, in contrast to a dc-powered OTFT-based ring oscillator which exhibited performance changes in less than ten minutes.

The availability of stable and reliable OTFT circuitry may promote wider use of OTFT circuitry in a variety of applications, with more reliable performance, durability and longevity. Consequently, various applications for ac-powered OTFT circuitry, including those described herein, may benefit from manufacturing advantages associated with OTFT circuitry, such as the ability to form circuitry on flexible substrates and use lower-cost manufacturing techniques.

As a further advantage, the use of ac power for the thin film circuitry may eliminate the need for the ac-dc rectifier circuitry otherwise required in some applications for delivery of dc power to the circuitry. Accordingly, by eliminating the need for rectifier circuitry, the use of ac power may reduce the manufacturing time, expense, cost, complexity, and size of components carrying thin film circuitry.

For RFID tags, as a particular example, the use of ac-powered thin film circuitry may substantially reduce the cost and size of the circuit by eliminating the ac-dc rectifier circuitry. In addition, the RFID tag may benefit from performance and reliability advantages associated with ac-powered OTFT circuitry, possibly creating new opportunities for application of RFID technology. For example, the increased reliability of ac-powered OTFTs may permit applications in which the RFID tag, in whatever form, is in more continuous or even persistent operation in conjunction with a reader unit.

Thin film transistors useful in forming ac-powered logic circuitry, as described herein, may take a variety of forms and may be manufactured using various manufacturing processes. For example, the thin film transistors may include organic semiconducting material, inorganic semiconducting material, or a combination of both. For some applications, organic and inorganic semiconducting materials can be used to form CMOS thin film transistor circuitry. Thin film transistors useful in forming ac-powered logic circuitry as described herein may include, without limitation, thin film transistors manufactured according to the techniques described in U.S. Pat. No. 6,433,359; U.S. patent application Ser. No. 10/012,654, filed Nov. 2, 2001; U.S. patent application Ser. No. 10/012,655, filed Nov. 5, 2001; U.S. patent application Ser. Nos. 10/076,174, 10/076,005, and 10/076,003, all filed on Feb. 14, 2002; and U.S. patent application Ser. No. 10/094,007, filed Mar. 7, 2002; the entire content of each being incorporated herein by reference.

Various modification may be made without departing from the spirit and scope of the invention. These and other embodiments are within the scope of the following claims.

The invention claimed is:
1. An electronic circuit comprising:
a load transistor and a drive transistor arranged to form a logic gate; and
an alternating current (ac) source to directly power the logic gate with an ac power waveform carrying an electrical voltage that alternates between a positive voltage and a negative voltage relative to ground, wherein the ac source includes a first terminal coupled to the load transistor and a second terminal coupled to the drive transistor, and the ac power waveform is applied across the first and second terminals.

2. The circuit of claim 1, wherein the logic gate includes one of an inverter, a NOR gate, and a NAND gate.

3. The circuit of claim 1, wherein the logic gte forms an analog amplifier.

4. The circuit of claim 1, further comprising a display element, wherein the logic gate is coupled to drive the display element.

5. The circuit of claim 4, wherein the display element includes one of a light emitting diode and a liquid crystal display element.

6. The circuit of claim 1, farther comprising a load capacitor coupled to an output of the logic gate.

7. The circuit of claim 6, wherein the logic gate is a first logic gate and the circuit further includes a second logic gate, wherein an output of the first logic gate drives an input of the second logic gate, and wherein the load capacitor is formed at least in part by an input capacitance of the second logic gate.

8. The circuit of claim 1, wherein the circuit includes a series of inverter stages, the inverter stages being coupled to form at least part of a ring oscillator.

9. The circuit of claim 8, further comprising:
a plurality of data lines; and
a plurality of logic gates that selectively output data from the data lines in response to a clock signal generated by the ring oscillator.

10. The circuit of claim 9, wherein the transistors include a plurality of thin film transistors arranged to form at least part of the logic gates.

11. The circuit of claim 1, wherein the ac power waveform has a period less than a propagation delay time of the logic gate.

12. The circuit of claim 1, wherein at least one of the transistors is an organic thin film transistor.

13. The circuit of claim 12, wherein at least one of the transistors is pentacene-based.

14. The circuit of claim 1, wherein at least one of the transistors is amorphous silicon-based.

15. The circuit of claim 1, wherein the logic gate comprises a CMOS logic gate.

16. The circuit of claim 1, wherein the transistors are formed on a flexible substrate.

17. The circuit of claim 1, wherein the logic gate forms part of a radio frequency identification (RFID) tag.

18. The circuit of claim 1, wherein a ratio of a gate width to a gate length of the load transistor is greater than or equal to a ratio of a gate width to a gate length of the drive transistor.

19. The circuit of claim 1, wherein the load transistor is coupled to the at source and the drive transistor is coupled to ground.

20. A method comprising powering a logic gate formed by at least a load transistor and a drive transistor with an alternating current (ac) power waveform carrying an electrical voltage that alternates between a positive voltage and a negative voltage relative to ground, the ac power waveform being produced by an alternating current (ac) power source, wherein the ac power source includes a first terminal coupled to the load transistor and a second terminal coupled to the drive transistor, and the ac power waveform is applied across the first and second terminals.

21. The method of claim 20, wherein the logic gate includes one of an inverter, a NOR gate, and a NAND gate.

22. The method of claim 21, further comprising operating the logic gate as an analog amplifier.

23. The method of claim 21, further comprising driving a display element with the logic gate.

24. The method of claim 23, wherein the display element includes one of a light emitting diode and a liquid crystal display element.

25. The method of claim 20, further comprising coupling a load capacitor to an output of the logic gate.

26. The method of claim 25, wherein the logic gate is a first logic gate, the method comprising driving an input of a second logic gate with an output of the first logic gate, and wherein the load capacitor is formed at least in part by an input capacitance of the second logic gate.

27. The method of claim 20, wherein the logic gate includes a series of inverter stages coupled to form at least part of a ring oscillator.

28. The method of claim 27, further comprising selectively outputting data from a plurality of data lines in response to a clock signal generated by the ring oscillator.

29. The method of claim 27, wherein the transistors include a plurality of thin film transistors arranged to form at least part of the logic gates.

30. The method of claim 20, wherein the ac power waveform has a period less than a propagation delay time of the logic gate.

31. The method of claim 20, wherein at least one of the transistors is an organic thin film transistor.

32. The method of claim 31, wherein at least one of the transistors is pentacene-based.

33. The method of claim 20, wherein at Least one of the transistors is amorphous silicon-based.

34. The method of claim 20, wherein the logic gate comprises a CMOS logic gate.

35. The method of claim 20, wherein the transistors are formed on a flexible substrate.

36. The method of claim 20, wherein the logic gate forms part of a radio frequency identification (RFID) tag.

37. The method of claim 20, wherein a ratio of a gate width to a gate length of the load transistor is greater than or equal to a ratio of a gate width to a gate length of the drive transistor.

38. The method of claim 20, wherein the load transistor is coupled to the ac source and the drive transistor is coupled to ground.

39. An electronic circuit comprising:
a first transistor and a second transistor arranged to form a logic gate; and
an alternating current (at) source coupled to directly power the logic gate with an at power waveform that carries positive and negative voltage relative to ground on an alternating basis,
wherein there is no intervening ac-dc rectification circuitry between the ac source and the logic gate, and
wherein the ac power waveform has a period less than a propagation delay time of the logic gate.

40. A method comprising powering a logic gate formed by at least a first transistor and a second transistor with an alternating current (ac) power waveform produced by an alternating current (ac) power source, wherein the ac power waveform carries positive and negative voltage relative to ground on an alternating basis, wherein there is no intervening ac-dc rectification circuitry between the ac source and the logic gate, and wherein the ac power waveform has a period less than a propagation delay time of the logic gate.

41. An electronic circuit comprising:
a logic gate comprising a load transistor and a drive transistor; and
an alternating current (ac) source that generates an ac power waveform carrying an electrical voltage that alternates between a positive voltage and a negative voltage relative to ground, wherein the ac source includes a first output terminal coupled to the load transistor wit substantially no intervening rectification circuitry and a second output terminal coupled to the drive transistor with substantially no intervening rectification circuitry, wherein the ac source directly powers the logic gate with the ac power waveform via the first and second output terminals.

42. The circuit of claim 41, wherein the ac power waveform has a period less than a propagation delay time of the logic gate.

43. The circuit of claim 41, wherein the logic gate includes one of an inverter, a NOR gate, and a NAND gate.

44. A method comprising:
generating, from an alternating current (ac) source, an ac power waveform carrying an electrical voltage that alternates between a positive voltage and a negative voltage relative to ground; and
applying the ac power waveform to directly power a logic gate comprising a load transistor and a drive transistor, wherein the ac source includes a first output terminal coupled to the load transistor with substantially no intervening rectification circuitry and a second output terminal coupled to the drive transistor with substantially no intervening rectification circuitry, the ac source directly powering the logic gate with the ac power waveform via the first and second output terminals.

45. The method of claim 44, wherein the ac power waveform has a period less than a propagation delay time of the logic gate.

46. The method of claim 44, wherein the logic gate includes one of an inverter, a NOR gate, and a NAND gate.

47. An electronic circuit comprising:
a first transistor and a second transistor arranged to form a logic gate; and
an alternating current (ac) source that directly powers the logic gate with an ac power waveform carrying an electrical voltage that alternates between a positive voltage and a negative voltage relative to ground, wherein the ac power waveform has a period less than a propagation delay time of the logic gate.

48. The circuit of claim 47, wherein the logic gate includes one of an inverter, a NOR gate, and a NAND gate.

49. A method comprising powering a logic gate formed by at least a first transistor and a second transistor with an alternating current (ac) power waveform produced by an alternating current (ac) power source, wherein the an power waveform carries an electrical voltage that alternates between a positive voltage and a negative voltage relative to ground, and wherein the ac power waveform has a period less than a propagation delay time of the logic gate.

50. The method of claim 49, wherein the logic gate includes one of an inverter, a NOR gate, and a NAND gate.

* * * * *

UNITED STATES PATENT AND TRADEMARK OFFICE
CERTIFICATE OF CORRECTION

| | | |
|---|---|---|
| PATENT NO. | : 7,088,145 B2 | Page 1 of 1 |
| APPLICATION NO. | : 10/328461 | |
| DATED | : August 8, 2006 | |
| INVENTOR(S) | : Paul F. Baude | |

It is certified that error appears in the above-identified patent and that said Letters Patent is hereby corrected as shown below:

In Column 2, line 51, delete "de" and insert -- dc --, therefor.

In Column 11, line 3, in claim 3, delete "gte" and insert -- gate --, therefor.

In Column 11, line 11, in claim 6, delete "farther" and insert -- further --, therefor.

In Column 11, line 50, in claim 19, delete "at" and insert -- ac --, therefor.

In Column 12, line 27, in claim 33, delete "Least" and insert -- least --, therefor.

In Column 12, line 45, in claim 39, delete "(at)" and insert -- ac --, therefor.

In Column 12, line 46, in claim 39, delete "at" and insert -- ac --, therefor.

In Column 13, line 3, in claim 41, delete "wit" and insert -- with --, therefor.

In Column 14, line 20, in claim 49, delete "an" and insert -- ac --, therefor.

Signed and Sealed this

Twenty-fourth Day of April, 2007

JON W. DUDAS
*Director of the United States Patent and Trademark Office*